United States Patent [19]
Kai et al.

[11] Patent Number: 5,899,731
[45] Date of Patent: May 4, 1999

[54] METHOD OF FABRICATING A SEMICONDUCTOR WAFER

[75] Inventors: Fumitaka Kai; Masahiko Maeda; Kenji Kawate, all of Kanagawa, Japan

[73] Assignee: Komatsu Electronic Metals Co., Ltd., Kanagawa, Japan

[21] Appl. No.: 08/927,034

[22] Filed: Sep. 10, 1997

[30] Foreign Application Priority Data

Sep. 12, 1996 [JP] Japan .................................. 8-279819

[51] Int. Cl.⁶ .................................................. C02F 1/461
[52] U.S. Cl. .......................................... 438/471; 205/746
[58] Field of Search .............................. 438/471; 205/746

[56] References Cited

U.S. PATENT DOCUMENTS 5,635,053 10/1995 Aoki et al. ............................. 205/746

OTHER PUBLICATIONS

Stanley Wolf Silicon Procesing for the VLSI Era Lattice Press pp. 24, 25, 516, 1986.

*Primary Examiner*—Charles Bowers
*Assistant Examiner*—David S. Blum
*Attorney, Agent, or Firm*—Sughrue, Mion, Zinn, Macpeak & Seas, PLLC

[57] ABSTRACT

A method of fabricating a semiconductor wafers, which can prevent metal contamination when alkali etching is used. A semiconductor ingot is cut into wafers. The peripheral portion of the sliced wafers is chamfered. The chamfered wafers are then planarized by lapping. The planarized wafers are alkali etched. The alkali etched wafers are subjected to acid washing by using diluted mixed acid solution. The surface of the acid-washed wafers are then polished. The polished wafers are washed again.

11 Claims, 14 Drawing Sheets

METHOD OF FABRICATING A SEMICONDUCTOR WAFER

BACKGROUND OF THE INVENTION

1. Field of the Invention

The present invention relates to a method of fabricating a semiconductor wafer obtained by polishing the surface thereof after alkali etching.

2. Description of the Prior Art

Working strains are produced on the surface and reverse surface of a semiconductor wafer planarized by means of lapping or surface grinding, and thus in order to remove the working strains, conventionally the semiconductor wafer is subjected to etching. The etching solution of the etching can be an alkali etching solution of KOH or NaOH or an acid etching solution of mixed acids.

A comparasion of each etching is described herinafter. For example, in the case of using a 40% aqueous solution of NaOH as an alkali etching soltuion, the etching rate is 4.0 $\mu$m/min. On the other hand, in the case of using a 40% mixed acid as an acid etching solution, the etching rate is 10 $\mu$m/min. Accordingly, even for etching solutions of the same concentration, the variation in rate of acid etching is quite large.

Furthermore, as a feature of alkali etching, as stated above, not only is the etching rate low for alkali etching in comparison with acid etching, the surface P-V value (P-V: Peak to Valley) is high, as can be seen from FIG. 4. That is, roughness is high, and thus the planarity obtained by lapping can be maintained. P-V value represents a deference between peak height and valley height.

On the other hand, the etching rate is high when an acid etching is used, and thus the planarity is easily damaged and the TTV (TTV: Total Thickness Variation) value is high. On the contrary, acid etching has the features that the surface is smooth and the P-V value is small. As a means for ensuring the planarity by the acid etching, a spin etching method is used. The method involves etching semiconductor wafers one piece at a time, and thus has poor throughput when compared with a batchwise method.

Accordingly, in attempt to increase the yield of the semiconductor device process, in the batchwise etching process used in recent years, alkali etching, which is readily able to maintain the planarity, is widely used.

However, the rate of removing metal contaminants is low for alkali etching, and thus if there are metal contaminants on the surface of semiconductor wafers before alkali etching, such metal contaminants remain on the wafers even after they are subjected to alkali etching.

Moreover, aqueous solutions of metal hydroxides such as KOH or NaOH are widely used as alkali etching solutions, and as a result, metal ions such as potassium and sodium ions remain on the wafers during etching, and become metal contaminants.

SUMMARY OF THE INVENTION

In view of the above problems, the object of the invention is to provide a manufacturing process for semiconductor wafers, which can prevent metal contaminants when alkali etching is used.

According to the invention, the manufacturing process of a semicondutor wafer obtained by alkali etching a planarized wafer, followed by polishing the alkali etched wafer, includes a metal contaminant-removal step to remove metals adhered to the surface of the alkali etched wafer.

According to the invention, metal contaminants, either not removed during the alkali etching step or newly formed during the alkali etching, are removed by the metal contaminant-removal step after the alkali etching step. The metal contaminant-removal step involves acid washing by using an aqueous solution of HF or diluted mixed acid, or washing by using warm water.

In acid washing, in order not to damage the planarity of the semiconductor wafer obtained by alkali etching and to keep the amount removed by etching washing below 5.0 $\mu$m, the etching capability of the washing solution is preferably as low as possible. Accordingly, it is appropriate to use mixed acid solutions, which are diluted with water and have a water concentration of 70–90%, such as aqueous solutions of HF, $HF/HNO_3$, $HF/HNO_3/CH_3COOH$ which have a lower etching rate, as acid-washing solutions.

Moreover, acid washing solutions are not limited to the above, by adjusting concentration and treating time, aqueous solutions of $HF/H_2O_2$, HCl, or $HCl/H_2O_2$ can also be used.

In addition, instead of washing with acid-washing solutions, washing with warm water is also effective. By washing with warm water having a temperature of 50–100° C., excellent results of removing metal contaminants of Na, Fe, and Zn are obtained. Preferably, the temperature of the warm water is 60–80° C. By selecting the temperature as above, metal contamination level is maintained low, and manufacturing cost is low and the process is performed safely.

BRIEF DESCRIPTION OF THE DRAWINGS

The present invention can be more fully understood by reference to the following examples and the accompanying drawings, in which.

DESCRIPTION OF THE PREFERRED EMBODIMENT

Example 1

Figure 1:
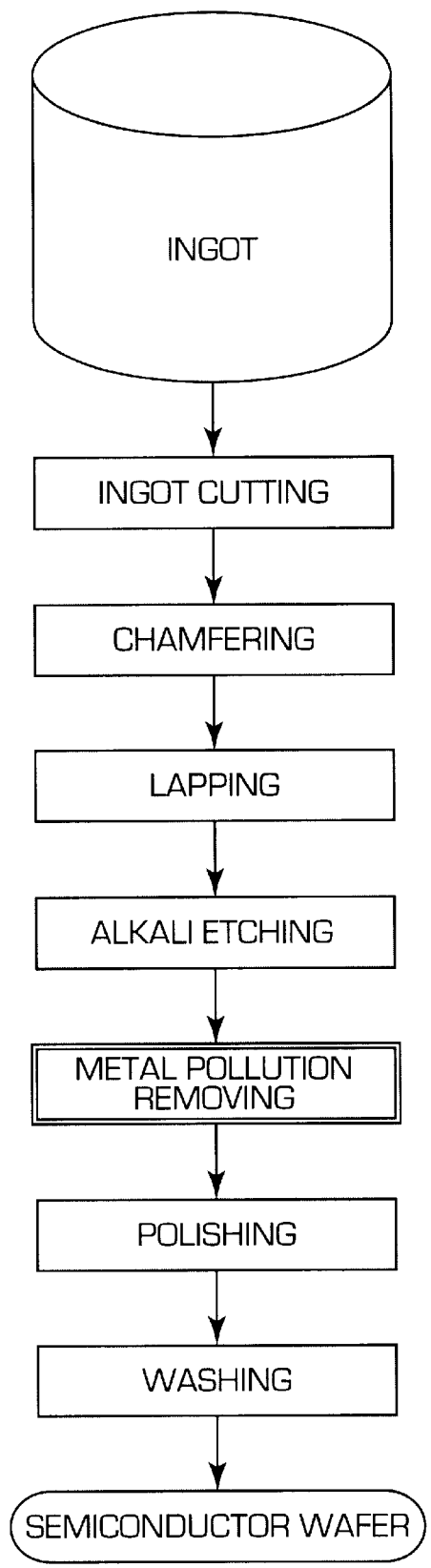
FIG. 1 is a flow chart of the manufacturing process of Example 1.
Figure 2:
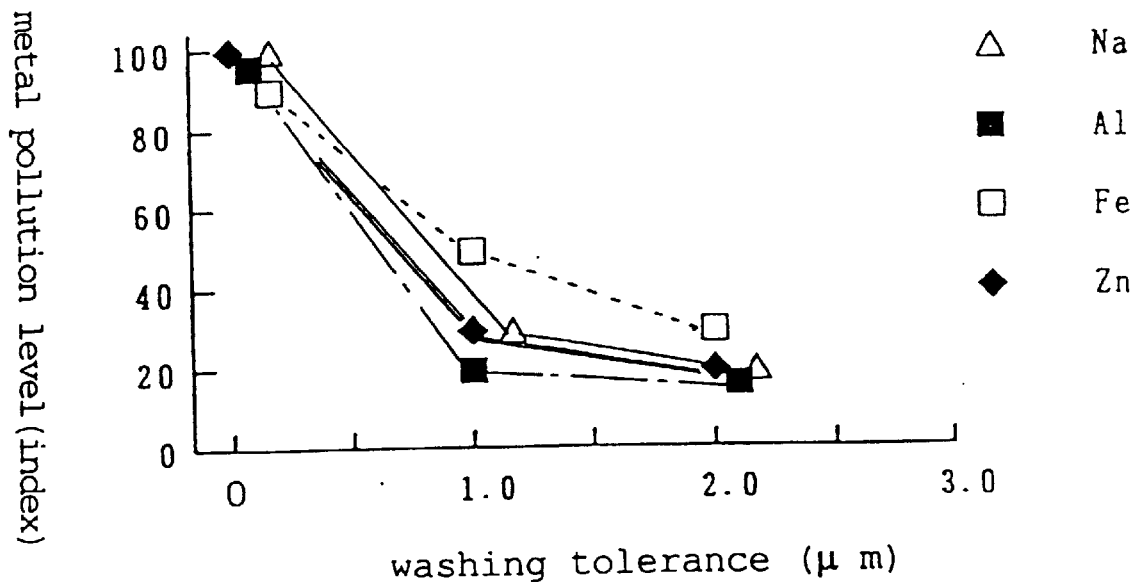
FIG. 2 is a graph showing the change in level of metal contaminant for semiconductor wafers manufactured by the manuacturing process of Example 1.

FIG. 1 is a flow chart of the manufacturing process of Example 1. FIG. 2 is a graph showing the change in level of metal contaminant for semiconductor wafers manufactured by the manuacturing process of Example 1. As shown in FIG. 1, the manufacturing process of Example 1 includes the following steps:

(1) slicing a semiconductor ingot to obtain a wafer;

(2) chamfering the peripheral portion of the sliced wafer;

(3) planarizing the surface and the reverse surface of the chamfered wafer by lapping in which working strains are produced on the surface and the reverse surface by lapping; and (4) alkali etching the planarized wafer and removing the working strains produced by lapping.

In this example, etching was performed by using NaOH as the alkali etching solution and the tolerance for one side was 5–30 µm. The working strains were removed, the entire planarity was maintained, and the TTV value after the alkali etching was about 1.0 µm.

On the alkali-etched surface of the wafer, about $10^{13}$ atoms/cm$^2$ of metal contaminants of Na, Al, Fe remain. If the metal contaminants are not removed and directly subject to heat treatment, contamination will be produced in the inside of the wafer crystal. Accordingly, an acid washing step as stated below was used as a metal contaminant-removal step in this Example.

(5) acid washing the alkali-etched wafer.

In the acid washing, in order not to damage the planarity maintained in the alkali etching, a mixed acid solution (HF/HNO$_3$/CH$_3$COOH) which is diluted with water and has a water concentration of 90% was prepared as washing solution, and the mixed acid solution was used to batchwise wash the wafer for 60 seconds.

As a result, as can be seen from FIG. 2, if the metal contamination level of the wafer prior to acid washing has an index of 100, the metal contamination level after the acid washing is significantly reduced.

Moreover, the TTV value after acid washing was measured and found to have been about 1.0 µm almost without change. And thus almost no influence on the planarity was found.

(6) polishing the acid-washed wafer.

(7) washing the polished wafer.

Example 2

Figure 3:
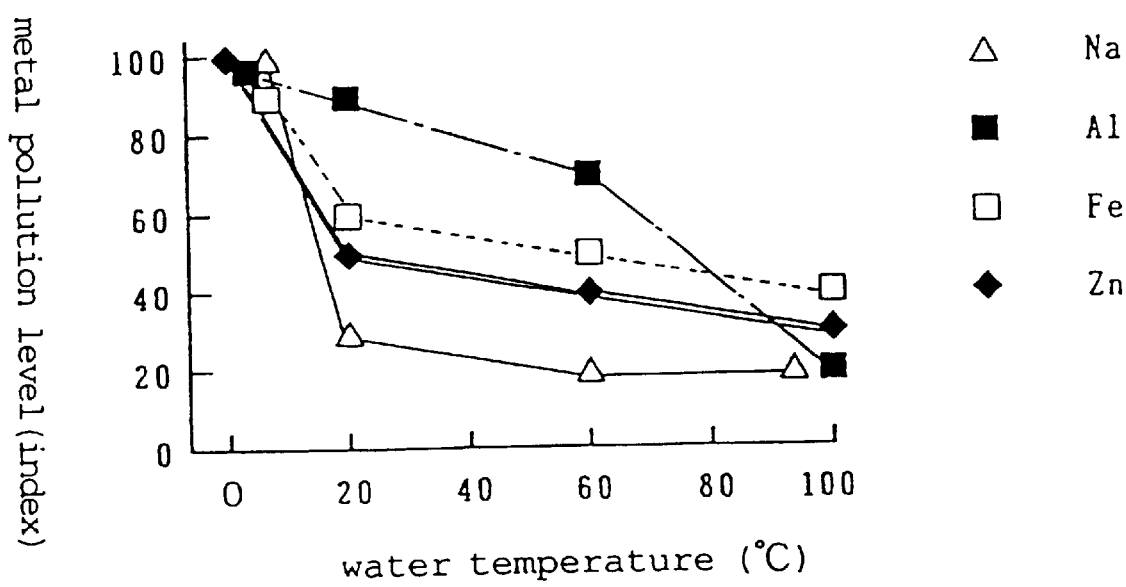
FIG. 3 is a graph showing the change in level of metal contaminant for semiconductor wafers manufactured by the manuacturing process of Example 2.
Figure 4:
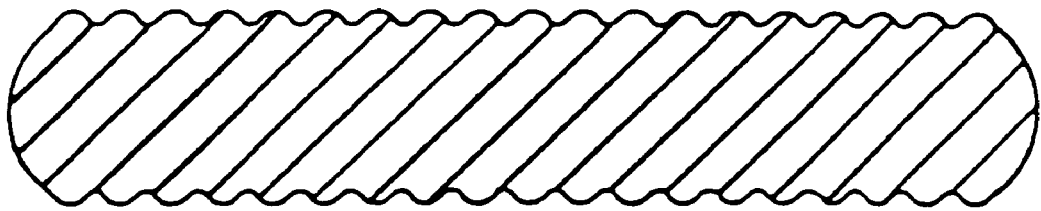
FIG. 4 is an elevational section view of semicondutor wafers obtained by alkli etching.
Figure 5:
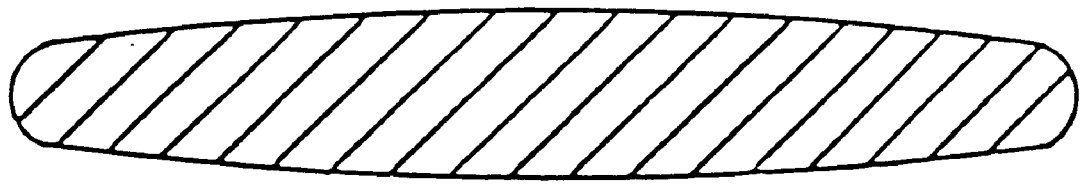
FIG. 5 is an elevational section view of semiconductor wafers obtained by acid etching.
Figure 6A:
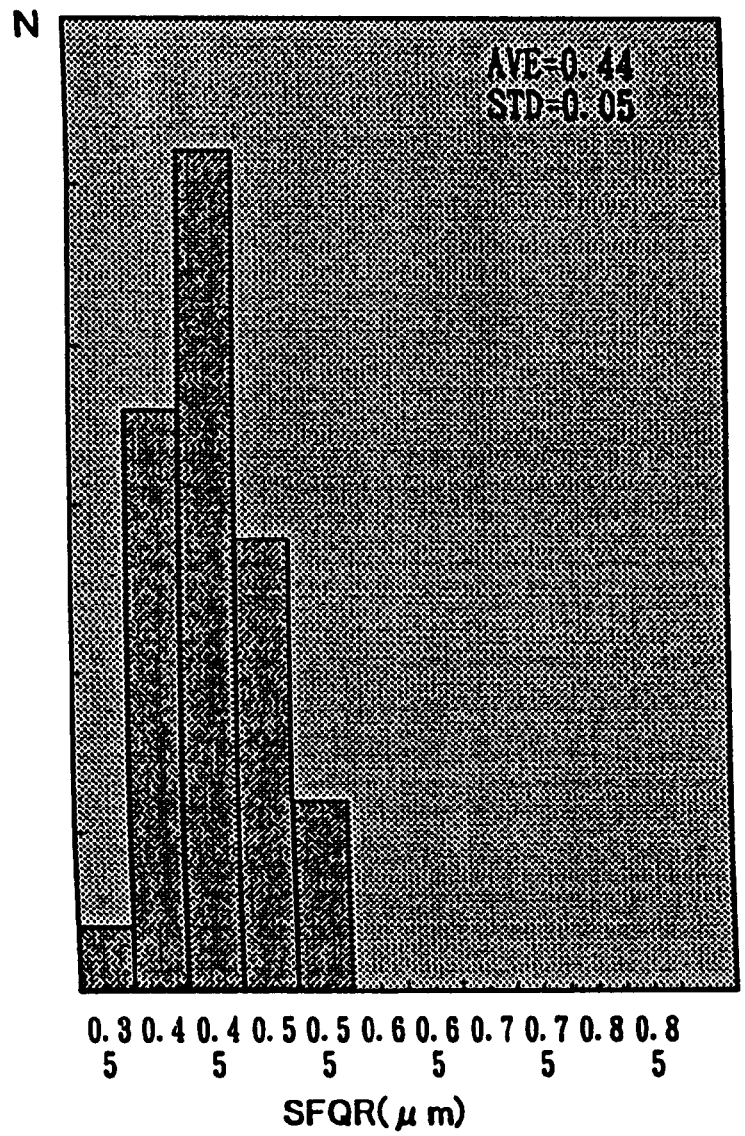
FIGS. 6A–6E are graphs of experimental data showing surface planarity at specific stages of wafer processing.
Figure 6B:
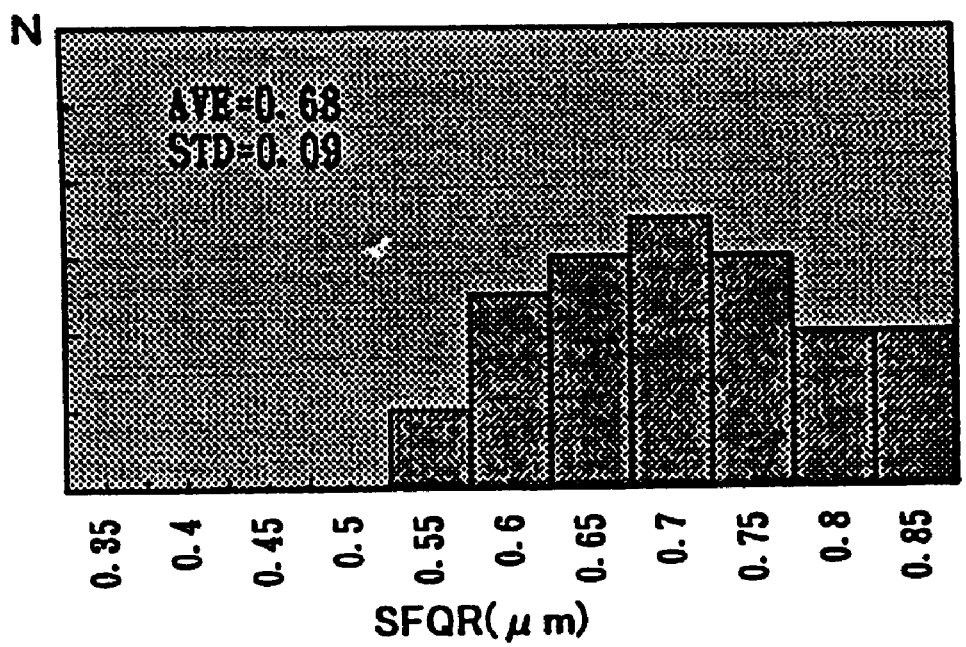
Figure 6C:
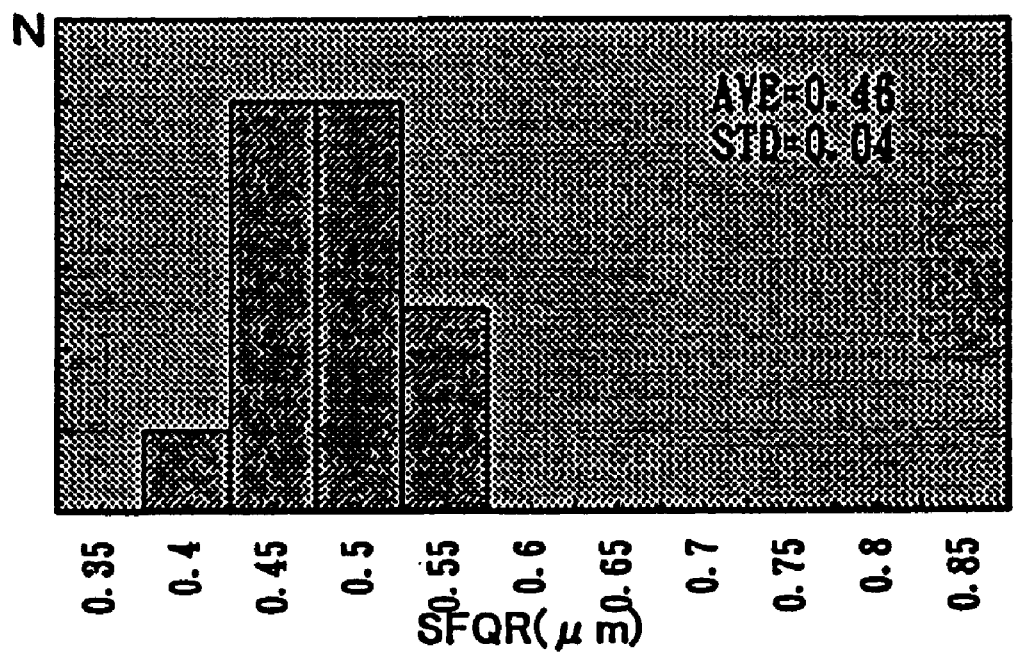
Figure 6D:
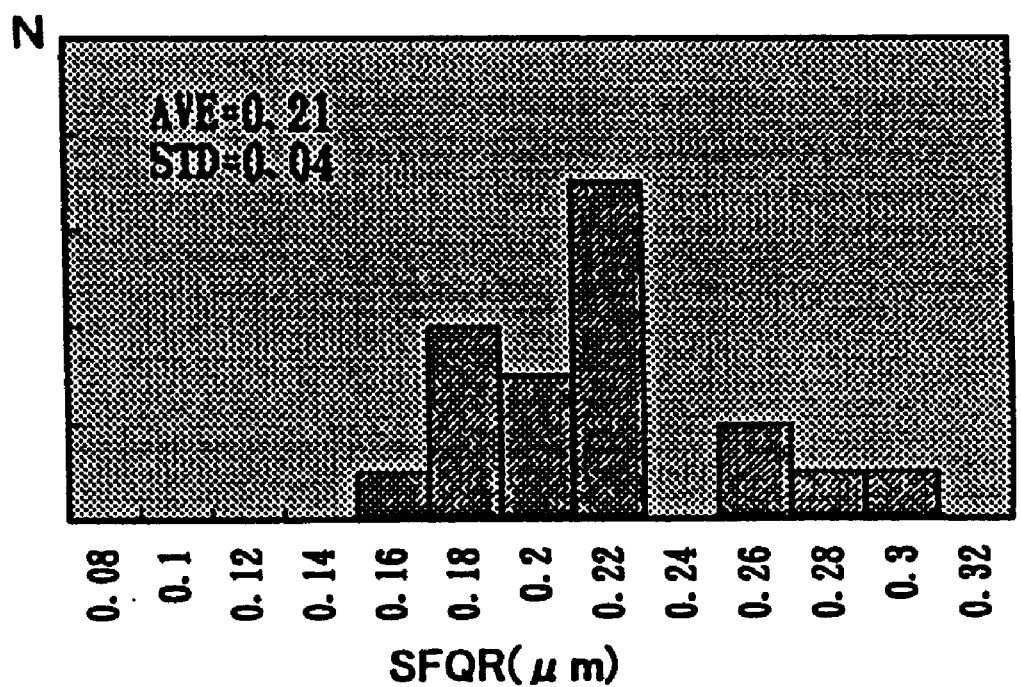
Figure 6E:
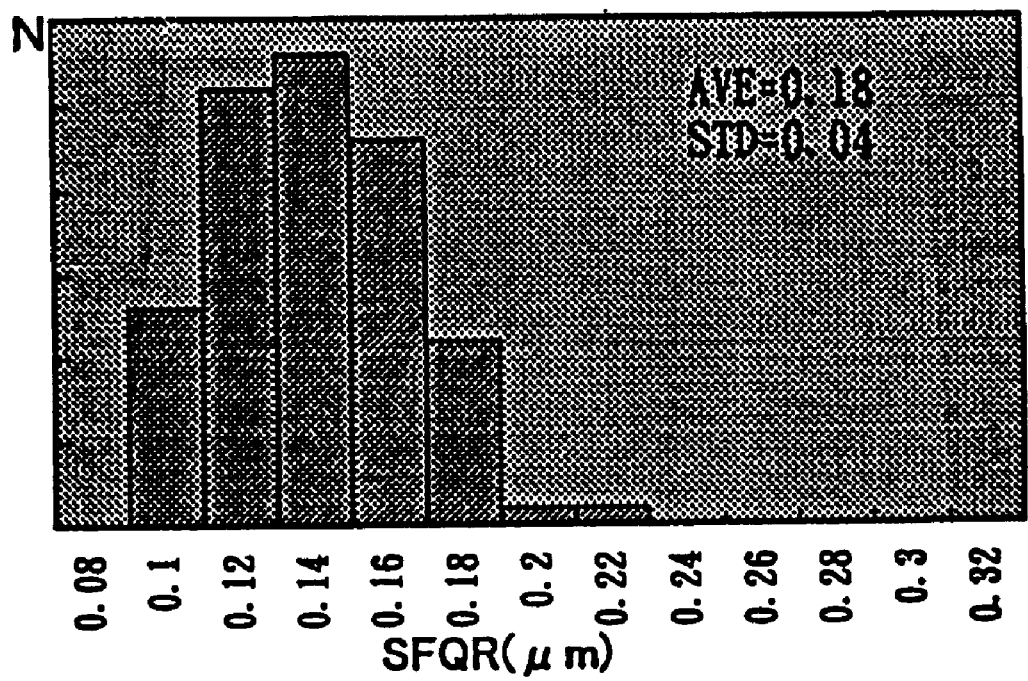
Figure 7A:
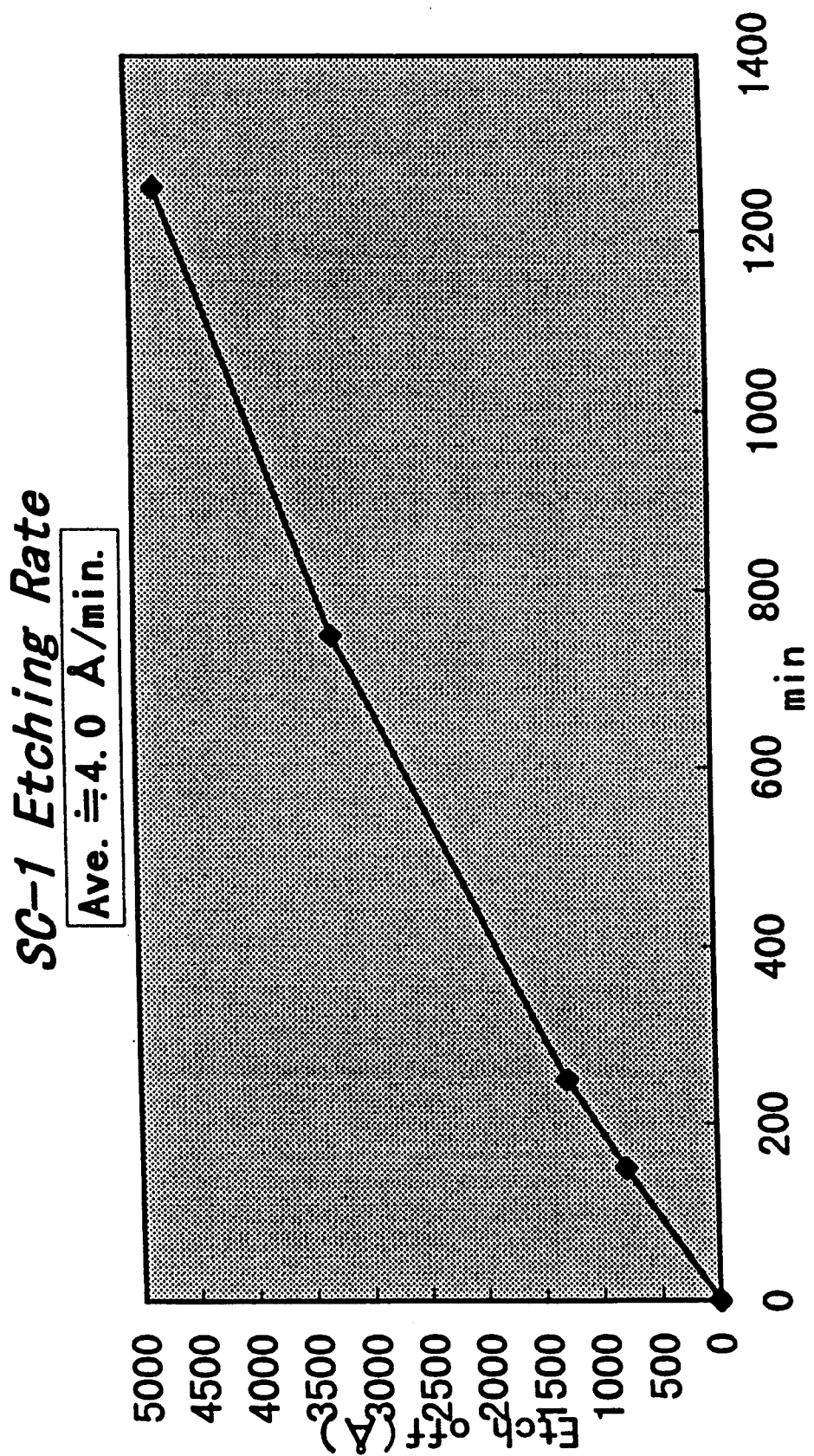
FIGS. 7A–7B are graphs of SC-1 and 40% NaOH (80° C.) etching rates, respectively.
Figure 7B:
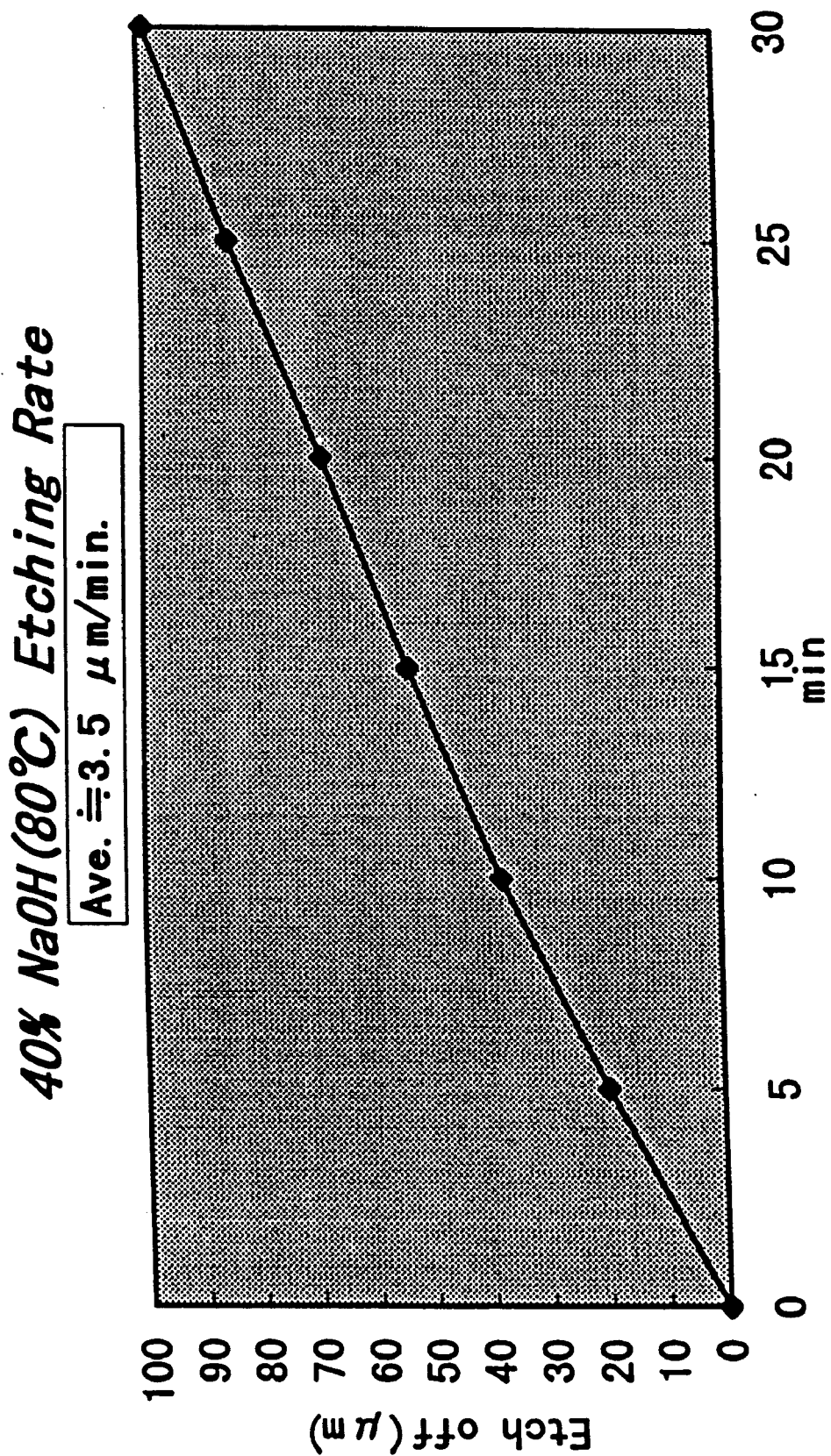
Figure 8A:
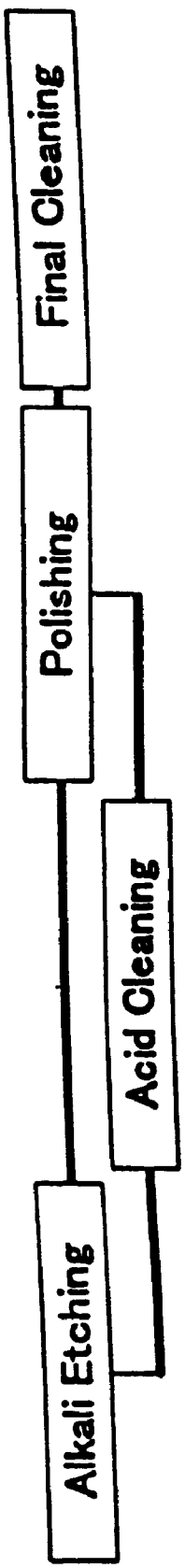
FIG. 8A is a flowchart for a process wherein metal-contaminant removal step is provided between alkali etching and polishing steps.
Figure 8B:
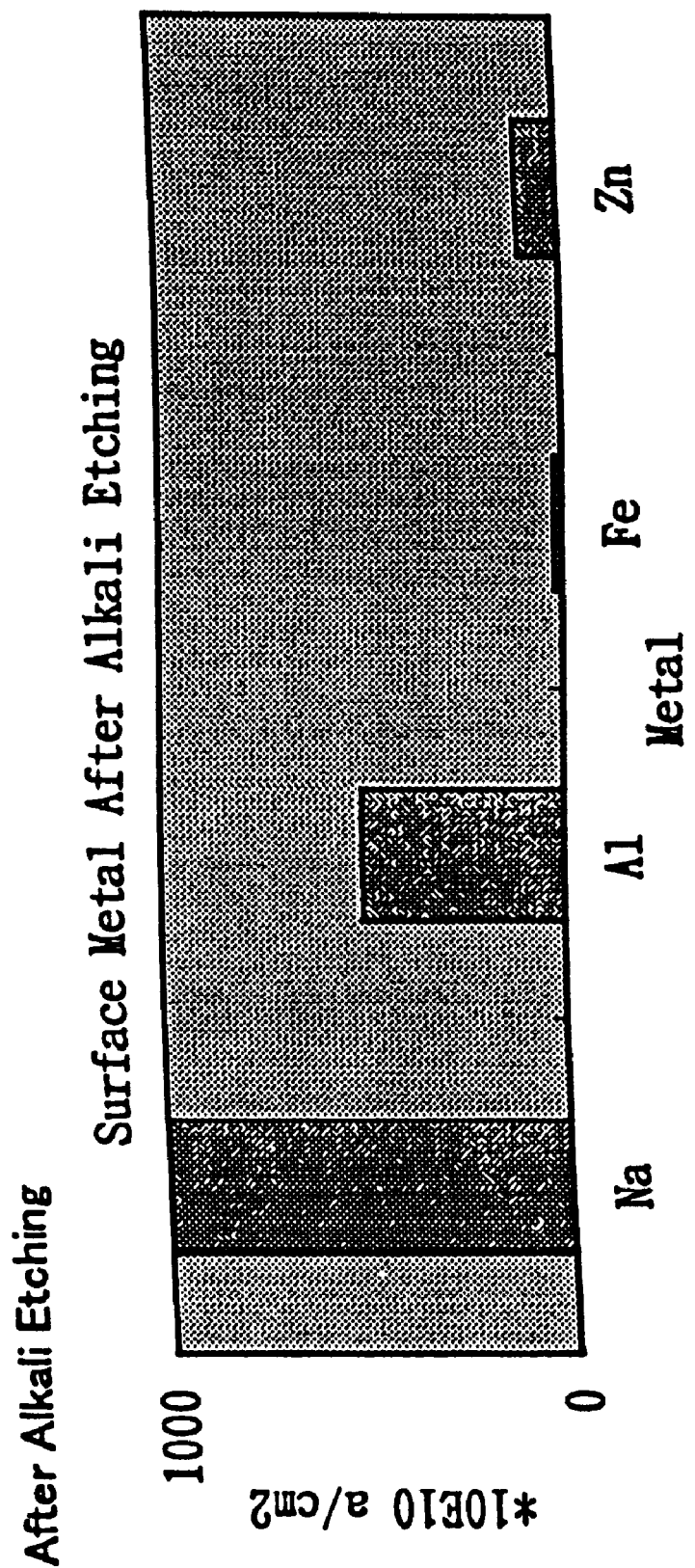
FIGS. 8B–8D are graphs depicting Contamination of wafers after certain wafer processing steps.
Figure 8C:
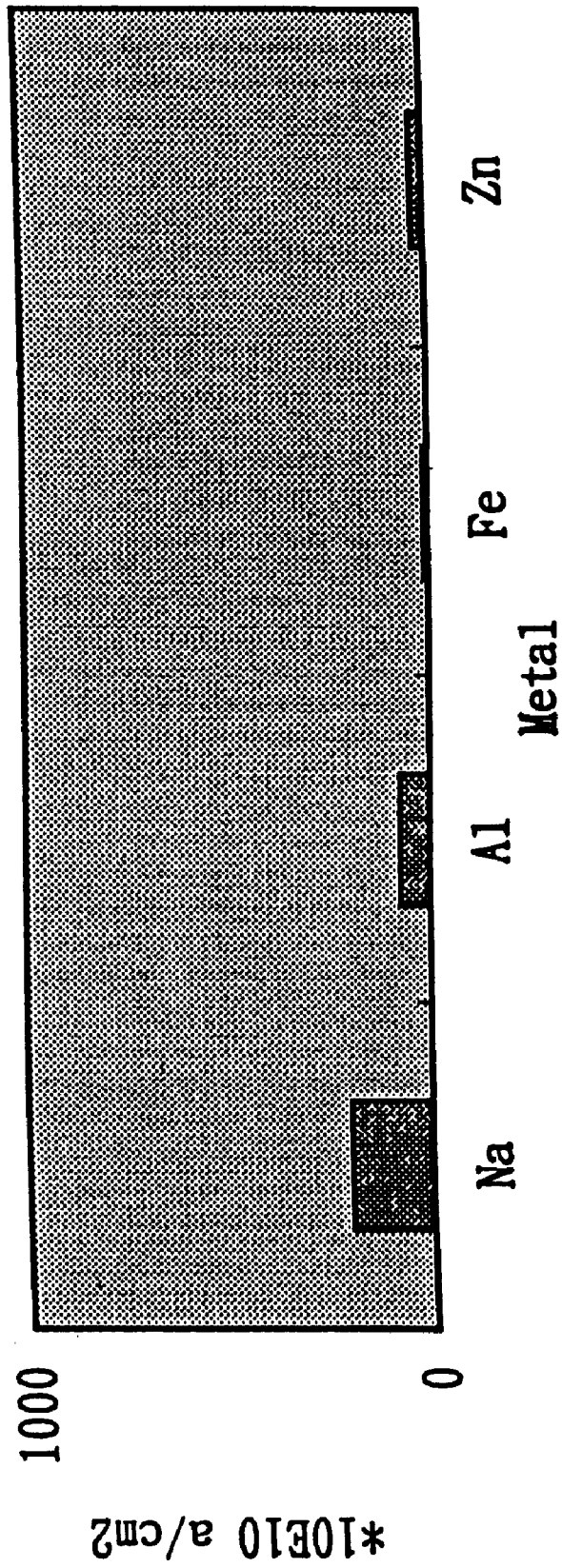
Figure 8D:
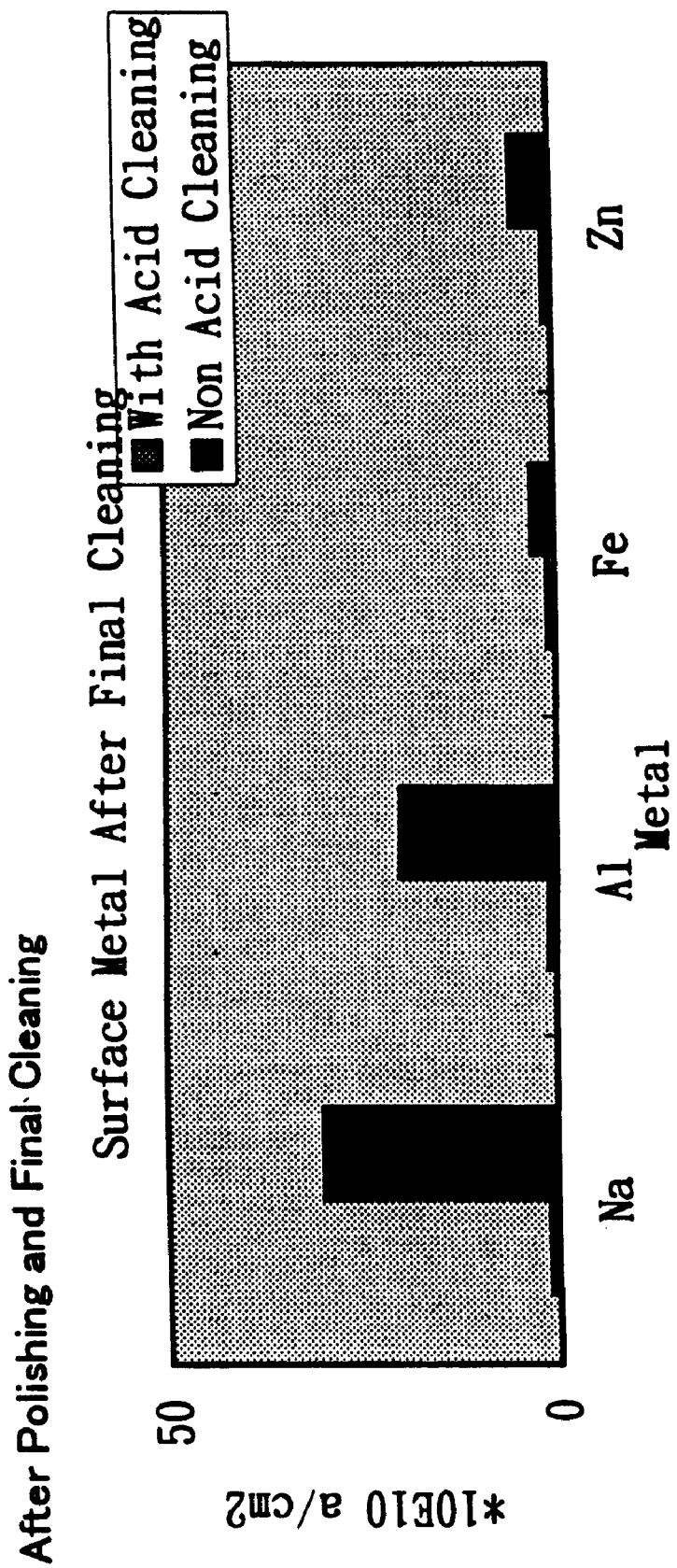

FIG. 3 is a graph showing the change in level of metal contamination for semiconductor wafers manufactured by the manfuacturing process of Example 2.

In the above Example 1, the metal contaminants were removed by acid washing alkali-etched semiconductor wafers. However, in this Example 2, instead of using acid washing, warm water washing was used. As can be seen from FIG. 3, the metal contamination level after washing decreases with a rise in the temperature of the warm water.

The metal removing capability by using warm water washing is slightly inferior to acid washing. However, as no chemicals are used, the washing is safer and does not affect the planarity of the wafers.

The invention is described as above and is highly effective at preventing the metal contamination problems in the manufacture of semiconductor wafers by alkali etching. In particular, in the recent manufacturing process of semiconductor wafers, the oxide film-forming process for the manufacture of SOI substrates and the measurement of oxide film resistance, and heat treating process such as donor killer treatment are widely used, and thus the manufacturing process of the invention is essential to manufacture high-quality semicondcutor wafers.

What is claimed is:

1. A method of fabricating a semiconductor wafer comprising the steps in the order of:

1) slicing a semiconductor ingot to obtain at least one semiconductor wafer;

2) chamfering a periphery of said wafer;

3) planarizing at least one surface of the wafer by lapping;

4) etching the planarized surface of the wafer by using a metal hydroxide solution as alkali solution so as to retain a planarity of the surface; and 5) mirror-polishing the wafer;

wherein a metal contaminant-removal step for removing metals adhered to the surface of the alkali-etched wafer is provided after the step of etching.

2. The method of fabricating a semiconductor wafer as claimed in claim 1, wherein the metal contaminant-removal step is provided between the alkali etching step and the polishing step.

3. The method of fabricating a semiconductor wafer as claimed in claim 1, wherein the metal contaminant-removal step is acid washing by acid solution.

4. The method of fabricating a semiconductor wafer as claimed in claim 1, wherein the metal contaminant-removal step is warm water washing step.

5. The method of fabricating a semiconductor wafer as claimed in claim 3, wherein the washing solution for acid washing is a solution which contains at least one selected from the group consisting of HF, HF/H$_2$O$_2$, HCl, HCl/H$_2$O$_2$, HF/HNO$_3$, and HF/HNO$_3$/CH$_3$COOH.

6. The method of fabricating a semiconductor wafer as claimed in claim 5, wherein the washing solution for acid washing has a low acid concentration such that the planarity of the wafer is not reduced.

7. The method of fabricating a semiconductor wafer as claimed in claim 3, wherein the washing solution for acid washing is a mixed acid solution of HF/HNO$_3$ or HF/HNO$_3$/CH$_3$COOH, and the mixed acid solution contains more than 70% of water.

8. The method of fabricating a semiconductor wafer as claimed in claim 3, wherein the washing solution for acid washing is a mixed acid solution of HF/HNO$_3$ or HF/HNO$_3$/CH$_3$COOH, the mixed acid solution contains less than 70% of water, and the washing time is short such that the planarity of the wafer is not reduced.

9. The method of fabricating a semiconductor wafer as claimed in claim 4, wherein a temperature of the warm water is within 50–100° C.

10. The method of fabricating a semiconductor wafer as claimed in claim 9, wherein a temperature of the warm water is within 60–80° C.

11. The method of fabricating a semiconductor wafer as claimed in claim 1, wherein the metal contaminant-removal step is a warm water washing step using warm water within 60–80° C.

* * * * *